US012757731B2

(12) United States Patent
Namyslo et al.

(10) Patent No.: US 12,757,731 B2
(45) Date of Patent: Oct. 6, 2026

(54) ARRANGEMENT FOR COOLING AND MOTOR MODULE

(71) Applicant: Siemens Aktiengesellschaft, Munich (DE)

(72) Inventors: Lutz Namyslo, Hausen (DE); Thomas Schwinn, Herzogenaurach (DE); Roman Kögler, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 389 days.

(21) Appl. No.: 18/029,133

(22) PCT Filed: Aug. 19, 2021

(86) PCT No.: PCT/EP2021/073019
§ 371 (c)(1),
(2) Date: Mar. 29, 2023

(87) PCT Pub. No.: WO2022/083919
PCT Pub. Date: Apr. 28, 2022

(65) Prior Publication Data

US 2024/0021492 A1 Jan. 18, 2024

(30) Foreign Application Priority Data

Oct. 21, 2020 (EP) ..................................... 20202967

(51) Int. Cl.
*H10W 40/43* (2026.01)
*H10W 40/22* (2026.01)
*H10W 90/00* (2026.01)

(52) U.S. Cl.
CPC ......... *H10W 40/228* (2026.01); *H10W 40/43* (2026.01); *H10W 90/00* (2026.01)

(58) Field of Classification Search
CPC . H01L 23/3677; H01L 23/467; H01L 25/072; H01L 25/18; H10W 40/228; H10W 40/43; H10W 90/00
See application file for complete search history.

(56) References Cited

U.S. PATENT DOCUMENTS 5,421,406 A 6/1995 Furusawa et al.
6,650,538 B1 * 11/2003 Chu ...................... H10W 40/43 257/722

(Continued)

FOREIGN PATENT DOCUMENTS

CN 2914600 6/2007
CN 107481981 12/2017

(Continued)

OTHER PUBLICATIONS

PCT International Search Report dated Dec. 20, 2021 based on PCT/EP2021/073019 filed Aug. 19, 2021.

*Primary Examiner* — Zandra V Smith
*Assistant Examiner* — Daniel J Hibbert
(74) *Attorney, Agent, or Firm* — Cozen O'Connor

(57) ABSTRACT

An arrangement for cooling semiconductor components includes a cooling body base with a component side and a structural element side opposite the component side, wherein the semiconductor components are arrangeable in succession in the flow direction of a cooling medium, the structural element side are configured to increase its surface area by structural elements, and the structural element side is configured such that a density of structural elements involved in the cooling increases in the flow direction with regard to cooling zones.

16 Claims, 4 Drawing Sheets

(56) References Cited

U.S. PATENT DOCUMENTS

| | | | | |
|---|---|---|---|---|
| 8,810,026 | B2 * | 8/2014 | Kadoguchi | H01L 23/4006 257/E23.101 |
| 2012/0014066 | A1 | 1/2012 | Morino et al. | |
| 2016/0029516 | A1 * | 1/2016 | Sever | F28F 3/022 165/104.34 |
| 2017/0170097 | A1 * | 6/2017 | Makino | H10W 40/43 |

FOREIGN PATENT DOCUMENTS

| | | |
|---|---|---|
| EP | 0340520 | 11/1989 |
| TW | 200503608 | 1/2005 |
| WO | 2013118869 | 8/2013 |

* cited by examiner

ARRANGEMENT FOR COOLING AND MOTOR MODULE

CROSS-REFERENCE TO RELATED APPLICATIONS

This is a U.S. national stage of application No. PCT/EP2021/073019 filed 19 Aug. 2021. Priority is claimed on European Application No. 20202967.4 filed 21 Oct. 2020, the content of which is incorporated herein by reference in its entirety.

BACKGROUND OF THE INVENTION

1. Field of the Invention

The invention relates to a converter for controlling a motor, in particular an inverter, and an arrangement for cooling semiconductor components comprising a cooling body base with a component side and a structural element side opposite the component side, where the semiconductor components can be arranged in succession in the flow direction of a cooling medium, and where the structural element side is configured to enlarge its surface with structural elements.

2. Description of the Related Art

It is known and typical from practice to use cooling bodies to cool semiconductor components.

EP 0 340 520 B1 discloses an arrangement for convectively cooling components, which has a cooling body composed of two parts arranged one above the other.

For manufacturing reasons and on account of a simpler structural design and/or a space-saving arrangement of semiconductor components, such as in motor modules, the semiconductor components, which are required to control a motor, are often arranged on a shared cooling body for heat dissipation purposes. These semiconductor components are placed one after the other with respect to a direction of a cooling medium flow, thereby producing a thermal series circuit. This thermal series circuit results in a reducing cooling effect, the further the respective semiconductor component to be cooled is distanced from an inlet of the cooling medium.

SUMMARY OF THE INVENTION

It is an object of the invention to provide an arrangement for cooling semiconductor components, in which a cooling medium still has an adequate temperature, even in the case of components to be cooled disposed at a further distance from an inlet, in order thus to deliver a cooling power for the component distanced further from the inlet.

This and other objects and advantages are achieved in accordance with the invention by an arrangement in which the structural element side is formed such that a density of structural elements involved in the cooling increases in the flow direction with regard to cooling zones.

The structural elements are provided to improve the heat transmission to the environment and thus to improve the cooling effect. The structural elements are generally in contact with a cooling medium. The density of the structural elements actively involved in the cooling increases in the direction of a longitudinal extent of the arrangement. As a result, components disposed at a further distance from an inlet can still be sufficiently cooled, because with a first component that is closer to an inlet the cooling medium is not saturated with respect to a cooling power and can thus no longer yield cooling power.

Within the meaning of the invention, density is understood to mean the number of active structural elements per surface unit, in particular in the cooling zones, where active is considered with regard to a cooling effect.

In an embodiment of the arrangement, the structural element side has a uniform distribution of structural elements, where the molded parts arranged on the structural element side are provided to thermally insulate at least one part of the structural elements.

In one possible embodiment, the molded parts can be inserted as sleeves by way of pin fins. With a conventional cooling body with pin fins, a uniform distribution of the structural elements accordingly exists, where a pin is considered to be a structural element.

An insulating sleeve of this type can be closed at its one end and open at its other end. The sleeves are advantageously attached in the region of the cooling body, in which the output of heat to the cooling medium is largely to be prevented, i.e., within a first cooling zone that lies in the vicinity of an inlet of the cooling medium. The pin fins provided with a sleeve are therefore thermally almost "switched off". Therefore, more cooling medium with a lower temperature reaches the region disposed at a further distance from the inlet and increases the cooling power there.

As already mentioned, a molded part can be formed as a sleeve and slid over a structural element. This achieves an arrangement in which at least one molded part is configured as a sleeve and is arranged over a structural element.

With another embodiment of a molded part, the arrangement is configured so that at least one molded part is formed as a first type of flow barrier and is slid over a structural element, where a first limb of the first type of flow barrier rests against a further directly adjacent structural element and a second limb of the first type of flow barrier rests against another directly adjacent structural element.

In another embodiment of a molded part with the arrangement, at least one molded part is formed via a second type of flow barrier and is slid over a structural element, where a first limb of the second type of flow barrier rests against a further adjacent structural element and a second limb of the second type of flow barrier rests against another adjacent structural element, where the limbs have a longitudinal extent which only permit an arrangement of the second type of flow barrier obliquely to the flow direction.

With a further special embodiment of a molded part, the arrangement has at least one molded part, which is formed as a medium guide band to achieve a targeted guidance of the cooling medium.

The object and advantages in accordance with the invention are likewise achieved by a converter the previously described arrangement for cooling in accordance with disclosed embodiments.

It is now advantageous inter alia that it is possible to dispense with a complex processing of a cooling body, because standard cooling bodies or cooling bodies with a uniform distribution of structural elements can now be used, for instance, and adjusted by targeted incorporation of molded parts, in particular into the cooling zones, to the corresponding cooling conditions. The desired heat distribution is achieved by the additional molded parts, which are subsequently introduced, e.g., in particular only during manufacture of the end product, e.g., a traction inverter. Depending on the application, different molded parts with identical cooling bodies are also conceivable. Advantageously, in terms of manufacturing costs, a variance formation can then only be defined very late in a production process, where storage and also spares inventory is simplified.

In particular, when modular cooling bodies or arrangements are used for cooling semiconductor components, these individual parts can be formed almost identically, as a result of which a variance in the production process and in the storage is advantageously minimized.

The converter is advantageously provided for vertical installation in a control cabinet, where a longitudinal axis of the arrangement is arranged vertically and the flow direction through the converter is thus produced parallel to the longitudinal axis and an inlet for a cooling medium is arranged below and an outlet for the cooling medium is arranged above.

A motor module can advantageously be established for a number of power semiconductors, where a first arrangement and a further arrangement which is essentially identical are arranged in succession in a flow direction.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment of the invention in which.

DETAILED DESCRIPTION OF THE EXEMPLARY EMBODIMENTS

Figure 1:
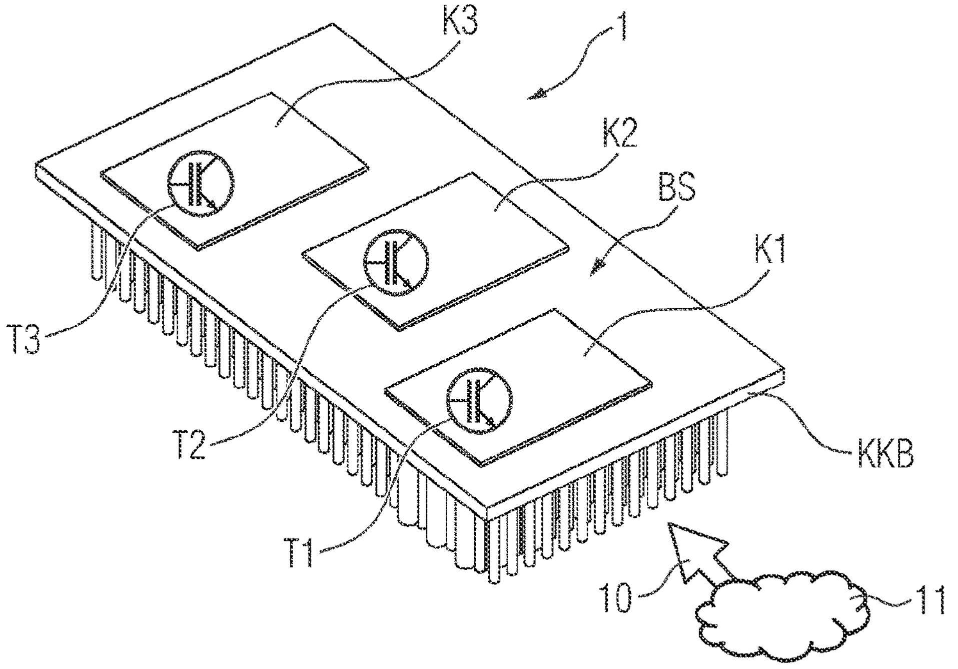
FIG. 1 shows a perspective view of an arrangement for cooling in accordance with the invention.

FIG. 1 shows an arrangement 1 for cooling semiconductor components T1, T2, T3 that are arranged in succession on a component side BS of a shared cooling body base KKB in the flow direction 10 of a cooling medium 11. The component side BS has a first cooling zone K1, a second cooling zone K2 and a third cooling zone K3 for positioning the semiconductor components T1, T2, T3.

Figure 2:
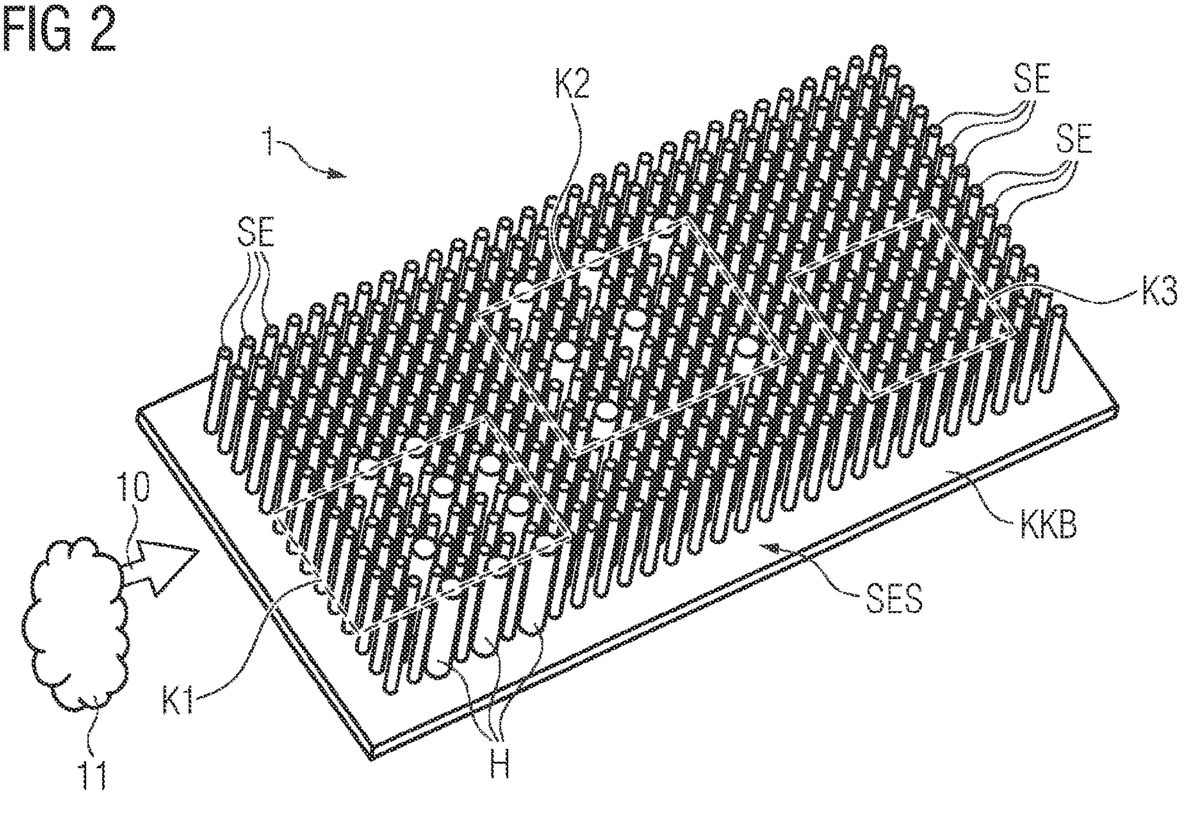
FIG. 2 shows another perspective view of the arrangement of FIG. 1.

With reference to FIG. 2, the perspective representation is selected on the structural element side SES. Numerous structural elements SE are arranged on the structural element side SES. The cooling zones K1, K2, K3 shown with FIG. 1 are shown with schematically dashed lines in the view depicted in FIG. 2.

The structural element side SES has a uniform distribution of structural elements SE, where via the arrangement of thermally insulating molded parts between and/or above one part of the structural elements SE, this part of structural elements SE is inactive with respect to a cooling effect. The first cooling zone K1 is in the vicinity of an inlet for the cooling medium 11. As a result, a number of molded parts can be inserted here in the form of sleeves H so that the through-flowing cooling medium 11 does not heat up so quickly and can still bring sufficient cooling power for the second cooling zone K2 and third cooling zone K3 arranged in succession.

Accordingly, nine sleeves H are inserted into the first cooling zone K1, in the second cooling zone K2 only seven sleeves H are still inserted and in the third cooling zone K3 no sleeve H is inserted. The density of structural elements SE involved in the cooling therefore increases with respect to the cooling zones K1, K2, K3.

Figure 3:
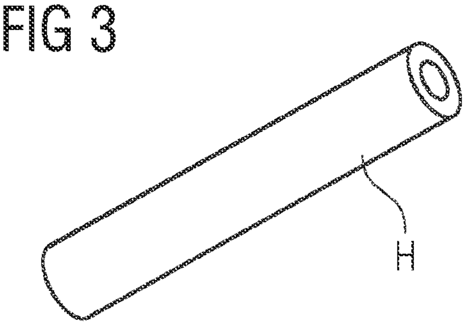
FIG. 3 shows a molded part formed as a sleeve in accordance with an embodiment of the invention.

In a first embodiment of a molded part, FIG. 3 shows a sleeve H with a blind hole, which is configured to be accurately inserted via a pin (i.e., the structural element SE).

Figure 4:
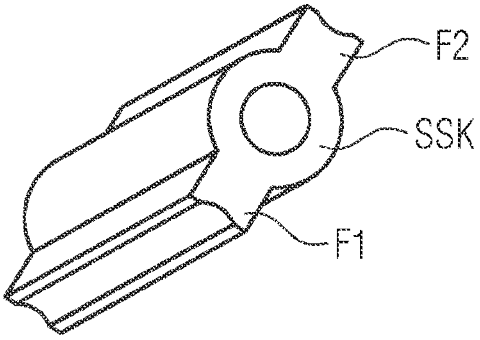
FIG. 4 shows an embodiment of a molded part formed as a first type of flow barrier.

With FIG. 4, an embodiment of the molded part is shown as a first type of flow barrier SSK. This first type of flow barrier SSK can likewise be slid over a structural element SE. In addition, the first type of flow barrier SSK has a first limb F1 and a second limb F2. The first limb F1 and the second limb F2 are each formed so that the limbs F1, F2 can rest against a first adjacent structural element SE' and against a second adjacent further structural element SE" (see, for instance, FIG. 7) in a form-fit manner.

Figure 5:
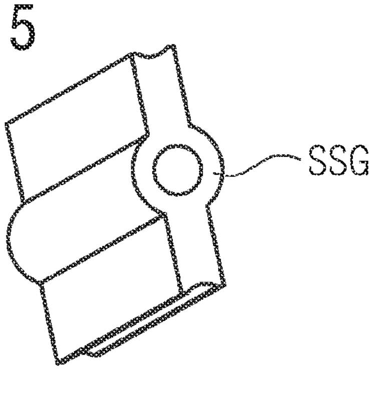
FIG. 5 shows an embodiment of a molded part formed as a second type of flow barrier.

Contrary to FIG. 4 where the first type of flow barrier SSK has been shown, FIG. 5 shows a somewhat larger second type of flow barrier SSK. The second type of flow barrier SSG is also configured to be able to be slid over a structural element SE, where the first limb F1 of the second type of flow barrier SSK can rest against a further adjacent structural element SE and a second limb F2 of the second type of flow barrier SSG can also rest against an adjacent structural element SE. The longitudinal extent of the limbs F1, F2 contrary to the first type of flow barrier SSK is however so long in the case of the second type of flow barrier SSG that this type of molded part can only be arranged obliquely with respect to the flow direction 10 between the structural elements SE.

Figure 6:
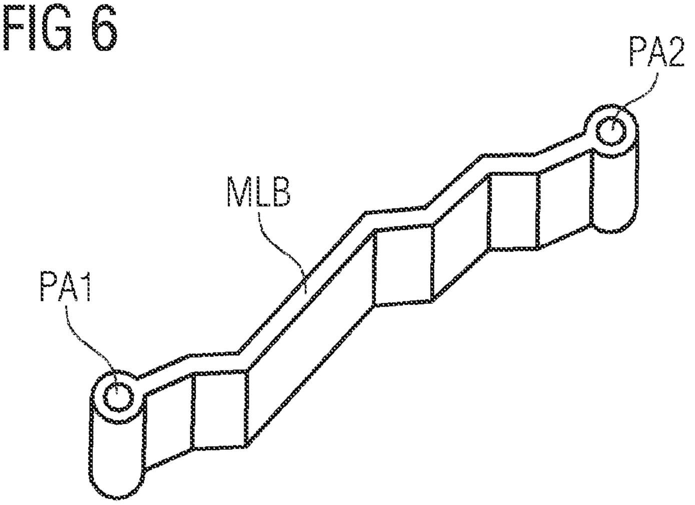
FIG. 6 shows an embodiment of a molded part formed as a medium guide band.

A further special type of molded part is shown in FIG. 6. The molded part is now formed as a medium guide band MLB to achieve a targeted guidance of the cooling medium. To this end, the medium guide band MLB has a longitudinal extent, which extends over a plurality of distances of structural elements SE. A first pin holder PA1 is arranged at a first end of the medium guide band MLB, and a second pin holder PA2 is arranged at a second end of the medium guide band MLB. The medium guide band MLB is configured to be heat-resistant and flexible. As a result, a medium guide band MLB can be used to influence a flow channel because it can be easily inserted between the structural elements SE like a rubber band.

Figure 7:
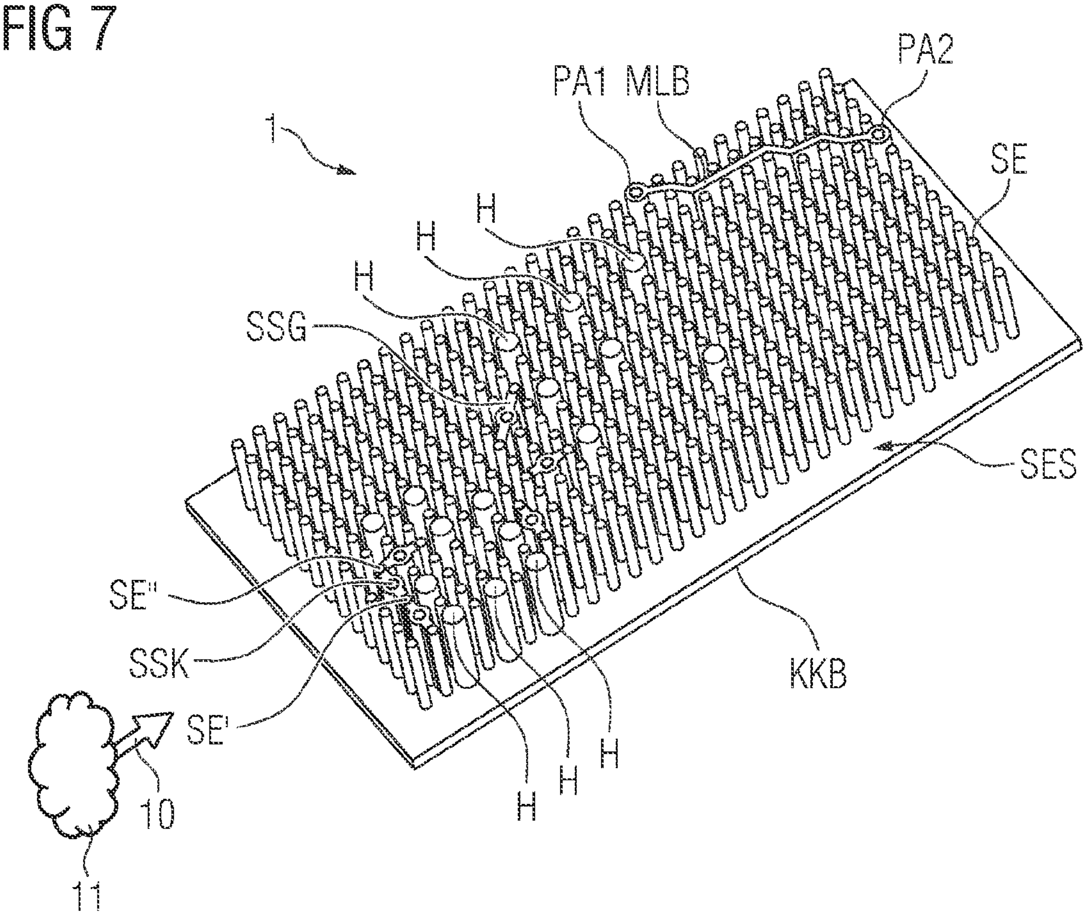
FIG. 7 shows a pin-fin cooling body with inserted molded parts in accordance with the invention.

FIG. 7 shows a cooling arrangement populated with the previously cited embodiments of the molded parts, for instance. A number of sleeves H and a number of first type of flow barriers SSK are placed in the lower part on an inlet for a cooling medium 11, for instance. If the second cooling zone K2 is approached, then a second type of flow barriers SSG for guiding the flow into the second cooling zone K2 is used just upstream of the second cooling zone K2. To ensure that the already deflected cooling medium flow through the second cooling zone K2 does not entirely escape from the structural elements SE and still reaches the third cooling zone K3, a type of spoiler is inserted through a medium guide band MLB and the originally deflected cooling flow is again deflected in another direction.

Figure 8:
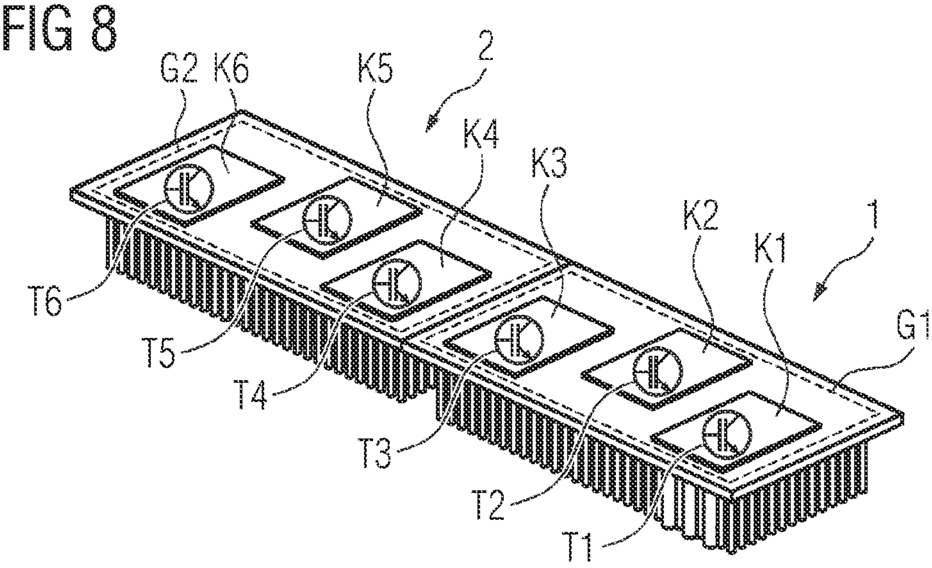
FIG. 8 shows two arrangements arranged in succession with grouping of semiconductor components in accordance with the invention.

FIG. 8 illustrates how the first arrangement 1 for cooling semiconductor components can be extended in a modular manner by a further second arrangement 2 for cooling semiconductor components. It may occur with a converter 20 (see FIG. 9) for instance that this is formed as a 2-axle inverter that can control two motors at the same time. Accordingly, a modularly composed arrangement comprising the first arrangement 1 and the second arrangement 2 exists, where a first group G1 of semiconductor components T1, T2, T3 to be cooled is produced and a second group G2 of semiconductor components T4, T5, T6 to be cooled is produced.

In the first group G1, the corresponding semiconductor components T1, T2, T3 find space in the corresponding cooling zones K1, K2, K3. In the second group G2, the further semiconductor components T4, T5, T6 find space in a fourth cooling zone K4, a fifth cooling zone K5 and a sixth cooling zone K6 accordingly.

Figure 9:
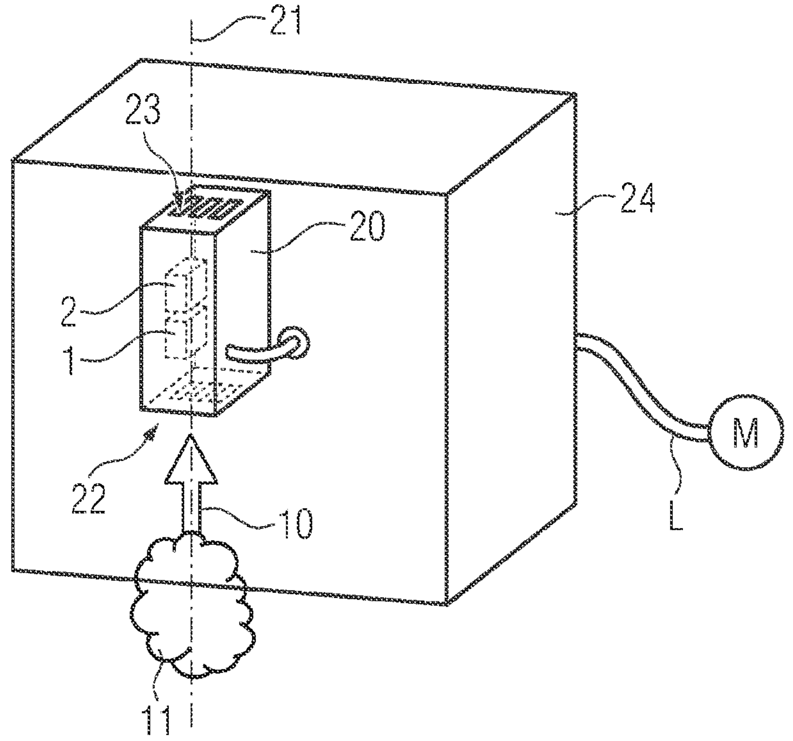
FIG. 9 shows a motor module in a control cabinet in accordance with the invention.

According to FIG. 9 a converter 20 is shown in a control cabinet 24. A longitudinal axis 21 of the converter 20 or the internally integrated arrangement 1 is arranged vertically and the flow direction 10 through the converter 20 is therefore arranged parallel to the longitudinal axis 21 and an inlet 22 for the cooling medium 11 is arranged below and an outlet 23 for the cooling medium 11 is arranged above. With the converter 20, a first arrangement 1 and a second arrangement 2 for cooling the components are arranged in succession in the flow direction 10. In particular, for a uniform temperature distribution on both arrangements 1, 2, the first, second, third cooling zone K1, K2, K3 of the first arrangement 1 are equipped with molded parts, wherein the number of molded parts reduces in the flow direction. The converter 20 can control a motor M by way of a line L.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An arrangement for cooling semiconductor components, the arrangement comprising:

a cooling body base having a component side and a structural element side opposite the component side, the semiconductor components being arrangeable in succession in a flow direction of a cooling medium; and wherein the structural element side is structured so as to provide an enlarged surface thereof via structural elements;

wherein molded parts arranged on the structural element side are provided to thermally insulate at least one part of the structural elements; and wherein the structural element side is configured such that a numerical density of actively cooling structural elements arranged along the flow direction of the cooling medium increases in the flow direction relative to cooling zones.

2. The arrangement as claimed in claim 1, wherein the structural element side has a uniform distribution of structural elements.

3. The arrangement as claimed in claim 2, wherein at least one molded part is formed as a sleeve and is slid over a structural element.

4. The arrangement as claimed in claim 2, wherein at least one molded part is formed as a first type of flow barrier and is slid over a structural element; and wherein a first limb of the first type of flow barrier rests against a further adjacent structural element and a second limb of the first type of flow barrier rests against another directly adjacent structural element.

5. The arrangement as claimed in claim 3, wherein at least one molded part is formed as a first type of flow barrier and is slid over a structural element; and wherein a first limb of the first type of flow barrier rests against a further adjacent structural element and a second limb of the first type of flow barrier rests against another directly adjacent structural element.

6. The arrangement as claimed in claim 2, wherein at least one molded part is formed as a second type of flow barrier and is slid over a structural element; wherein a first limb of the second type of flow barrier rests against a further adjacent structural element and a second limb of the second type of flow barrier rests against another adjacent structural element; and wherein the limbs have a longitudinal extent which only permit an arrangement of the second type of flow barrier obliquely to the flow direction.

7. The arrangement as claimed in claim 3, wherein at least one molded part is formed as a second type of flow barrier and is slid over a structural element; wherein a first limb of the second type of flow barrier rests against a further adjacent structural element and a second limb of the second type of flow barrier rests against another adjacent structural element; and wherein the limbs have a longitudinal extent which only permit an arrangement of the second type of flow barrier obliquely to the flow direction.

8. The arrangement as claimed in claim 4, wherein at least one molded part is formed as a second type of flow barrier and is slid over a structural element; wherein a first limb of the second type of flow barrier rests against a further adjacent structural element and a second limb of the second type of flow barrier rests against another adjacent structural element; and wherein the limbs have a longitudinal extent which only permit an arrangement of the second type of flow barrier obliquely to the flow direction.

9. The arrangement as claimed in claim 2, wherein at least one molded part is formed as a medium guide band to achieve a targeted guidance of the cooling medium.

10. The arrangement as claimed in claim 3, wherein at least one molded part is formed as a medium guide band to achieve a targeted guidance of the cooling medium.

11. The arrangement as claimed in claim 4, wherein at least one molded part is formed as a medium guide band to achieve a targeted guidance of the cooling medium.

12. The arrangement as claimed in claim 8, wherein at least one molded part is formed as a medium guide band to achieve a targeted guidance of the cooling medium.

13. A converter for controlling a motor comprising the arrangement as claimed in claim 1.

14. The converter as claimed in claim 13, wherein the converter is vertically installed in a control cabinet, wherein a longitudinal axis of the arrangement is arranged vertically such that the flow direction through the converter is produced parallel to the longitudinal axis and an inlet for a cooling medium is arranged below and an outlet for the cooling medium is arranged above.

15. The converter as claimed in claim 13, wherein a first arrangement and a second arrangement identical to the first arrangement are arranged in succession in the flow direction with respect to the structural element side; and wherein fewer molded parts are arranged on the second arrangement.

16. The converter as claimed in claim 14, wherein a first arrangement and a second arrangement identical to the first arrangement are arranged in succession in the flow direction with respect to the structural element side; and wherein fewer molded parts are arranged on the second arrangement.

* * * * *